United States Patent [19]

Curtis

[11] Patent Number: 5,445,916

[45] Date of Patent: * Aug. 29, 1995

[54] PHOTOSENSITIVE COMPOSITIONS

[75] Inventor: John Curtis, Princeton, N.J.

[73] Assignee: Ulano Corporation, Brooklyn, N.Y.

[ * ] Notice: The portion of the term of this patent subsequent to Apr. 5, 2011 has been disclaimed.

[21] Appl. No.: 42,683

[22] Filed: Apr. 5, 1993

Related U.S. Application Data

[62] Division of Ser. No. 889,933, Jun. 2, 1992, abandoned.

[51] Int. Cl.$^6$ ............................................. G03C 1/492
[52] U.S. Cl. ..................... 430/270; 430/287; 430/906; 430/909; 522/149; 525/59; 525/61
[58] Field of Search ............... 430/270, 287, 906, 909; 522/149; 525/59, 61

[56] References Cited

U.S. PATENT DOCUMENTS

| | | | |
|---|---|---|---|
| 2,811,443 | 10/1957 | Robertson et al. | 96/35 |
| 4,891,300 | 1/1990 | Ichimura et al. | 430/283 |
| 5,134,047 | 7/1992 | Inada et al. | 430/23 |
| 5,206,113 | 4/1993 | Mueller-Hess et al. | 430/270 |
| 5,326,669 | 7/1994 | Curtis | 430/281 |

OTHER PUBLICATIONS

Preparation and Charateristics of Photcrosslinkable Poly (vinyl–Alcohol), Ichimura, K., et al., vol. 20, 1419–1430–1432 (1982).

Defensive Publication T871,009., Borden, D. G. et al.

*Primary Examiner*—Mark A. Chapman
*Attorney, Agent, or Firm*—Charles E. Baxley

[57] ABSTRACT

Photopolymers based on polyvinyl alcohol derivatives of 8-hydroxy quinoline compositions having a high degree of photosensitivity, a marked degree of water solubility, and the ability to photodimerize when exposed to actinic radiation.

6 Claims, No Drawings

PHOTOSENSITIVE COMPOSITIONS

This is a divisional of application Ser. No. 07/889,933, filed Jun. 2, 1992 now abandoned.

FIELD OF INVENTION

The present invention relates to photosensitive polymeric materials suitable for producing resists, printing plates, relief images, and inks and to processes for the preparation of these materials.

THE PRIOR ART

Photosensitive resists can be suitable for a wide variety of uses, including the preparation of several types of printing forms, including screen printing resists, printing plates and resists for the preparation of various stages of circuit board manufacture, as well as UV curable inks and overprint varnishes.

Water soluble or water processable photoresist materials have several advantages, encompassing such aspects as safety in handling, cost, and ease of processing after exposure. Additionally, water soluble or water swellable photopolymer materials can be used in such diverse applications as the manufacture of color and black and white TV screens, and the immobilization of enzymes or living micro organisms. In the last mentioned application, it is an absolute necessity to utilize innocuous materials to prevent damage or destruction of the material under investigation during the immobilization stage.

Water processable systems that have previously been used in one or more applications mentioned above are as follows:

a) Dichromate sensitized, water-soluble colloids. The use of these materials is diminishing due to the heavy metal toxicity and subsequent environmental hazard, as well as an underlying "dark" reaction that results in poor stability of sensitized products.

b) Diazo resins. These are usually condensation products of diazodiphenylamine with formaldehyde, often isolated as metal-free salts. They are used to sensitize a water soluble colloid (often polyvinyl alcohol), and suffer from a limited shelf life, especially under warm, moist conditions, and relatively slow photospeed.

c) Free radical initiated systems. These consist of an initiator capable of forming free radicals when irradiated with actinic light, one or more unsaturated monomers or oligomers that contain vinyl unsaturation, and a water soluble colloid. These systems have a double disadvantage of being both oxygen and moisture sensitive, which can lead to exposure speed variations. They can also be heat sensitive and polymerize on storage at elevated temperatures.

d) Photodimerizable systems. These exhibit many desirable properties and are stable to heat, moisture and oxygen. The system can be best characterized by polyvinyl cinnamate, which has found wide use in commercial photosensitive products.

Water soluble resins based on a styrylpyridinium salt, possessing a formyl or acetal group which is utilized to react with polyvinyl alcohol and so produce a photopolymer that contains photodimerizable substituents along the polymer chain, have been described, as having chalcone derivatives similarly attached to polyvinyl alcohol. The stilbene derivatives are usually more efficient than the chalcone types.

Photopolymers as characterized by U.S. Pat. Nos. 4,339,524, 4564,580, 4,272,620, Euro patent 0 313 220 and 0 373 537, utilize a stilbazoliumquaternary system. However, the connection point to the polyvinyl alcohol is via a formyl or acetal grouping attached to the styryl entity. This severely restricts the capability to modify the absorption characteristics of the chromophore, and hence, all photopolymer compositions within the "family". The styryl grouping makes such a major contribution to the absorption characteristics of the overall molecule, that having to restrict that component of the chromophore by using it as a connecting point to the colloid, drastically limits what advantageous substituents can be incorporated in that part of the molecule. It also places a very severe restriction as to what raw materials can effectively (and practically) be utilized to prepare a photosensitive resins of the particular type described by the aforementioned patents.

THE PRESENT INVENTION

The present invention describes a range of novel photopolymers that have a high degree of photosensitivity a marked degree of water solubility, and the ability to photodimerize when exposed to light of a suitable wavelength. These photopolymers are based on polyvinyl alcohol derivatives of hydroxy-quinoline compounds, preferably of 8-hydroxyquinoline. The invention also relates to processes for the preparation of these compounds. The photosensitive resins of this invention are capable of forming a solubility differential after exposure to actinic light through a suitable mask or positive and are useful for applications as the preparation of printing plates, relief images several types of printing formes, including screen printing resists, printing plates and resists for the preparation of various stages of circuit board manufacture, as well as UV curable inks and overprint varnishes. Water soluble or water processable photoresist materials have several advantages, encompassing such aspects as safety in handling, cost, and ease of processing after exposure. Additionally, water soluble or water swellable photopolymer materials can be used in such diverse applications as the manufacture of color and black and white TV screens, and the immobilization of enzymes or living micro organisms. In the last mentioned application, it is an absolute necessity to utilize innocuous materials to prevent damage or destruction of the material under investigation during the immobilization stage.

In accordance with the present invention there are provided photosensitive polymer compounds, based on polyvinyl alcohol derivatives of hydroxy-quinolines, preferably 8-hydroxyquinolines, of the structure:

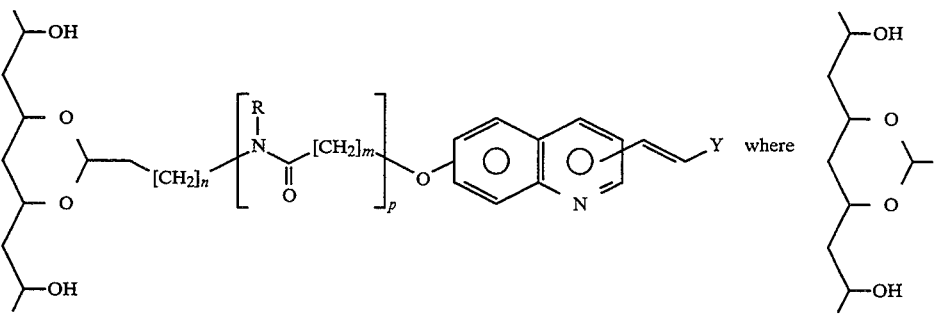

represents a unit of polyvinyl alcohol,
n is an integer from 1 to 6, preferably 1 to 3,
R is alkyl or substituted alkyl,
m is an integer from 1 to 6, preferably 1 to 3,
p is either zero or 1, and

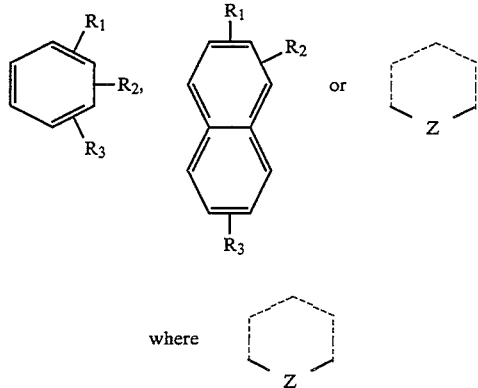

where is a 5 or 6 membered heterocyclic ring, preferably where saturated, in which Z is nitrogen, substituted nitrogen, oxygen or sulfur, and $R_1$, $R_2$, and $R_3$, are hydrogen, alkyl, alkenyl, alkoxy, aralkyl, substituted alkyl, substituted alkoxy, carboxy, carboxy ester, amino, substituted amino, amido, substituted amido, cyano, hydroxy, nitro, isocyanato, sulphonyl halide, sulphonic acid, or halide and may be the same or different, or $R_1$ and $R_2$ may be joined to form methylenedioxy, ethylenedioxy, and the like.

The alkyl groups in alkyl and alkyl containing groups such as for example, alkoxyand alkylamino, preferably contain from 1 to 6 carbon atoms. The alkenyl groups preferably contain from 1 to 6 carbon atoms.

The compounds of this invention are readily obtained by heating an aqueous, acidic solution of polyvinyl alcohol with a quinoline compound of the formula:

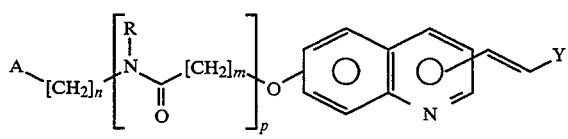

where n, m, p, R, and Y are the same as previously defined and A is a formyl group or an acetal of the structure

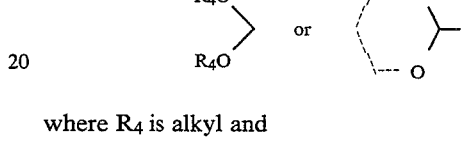

where $R_4$ is alkyl and

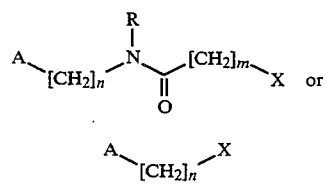

is a saturated cyclic structure having from 1 to 4 methylene groups.

The term "polyvinyl alcohol" refers to a saponified vinyl acetate polymer having a saponification degree of 70 to 99 mol %. Thus, if the starting vinyl acetate polymer is a homopolymer of vinyl acetate, the content of the vinyl alcohol units is 70 to 99 mol %; i.e., a vinyl alcohol polymer having a vinyl alcohol content of 70 to 99 mol %. Accordingly, the content of the monomer copolymerizable with vinyl acetate, which constitutes the vinyl acetate polymer, is restricted so that the above-mentioned value of the saponification degree can be given. It is preferred that the polymerization degree of the vinyl acetate polymer be from 300 to 3,000.

The current invention is particularly advantageous in that it utilizes an inexpensive bulk chemical, 8-hydroxyquinaldine as the parent base which can be reacted with any number of substituted aryl and hetrocyclic aldehydes. The hydroxy grouping on the so formed styryl/quinoline base is subsequently reacted with a halo containing aldehyde or acetal containing entity as characterized by $$A\text{-}[CH_2]_n\text{-}\underset{\underset{O}{\|}}{N(R)}\text{-}[CH_2]_m\text{-}X \quad \text{or}$$

$$A\text{-}[CH_2]_n\text{-}X$$

where A, n, R, and m are as defined above and X is a halogen, preferably chloro.

The preparation of the above reactant is shown below.

The current patent utilizes a facile and high yield reaction to fabricate one of the intermediates that is to be utilized as the colloid connecting point. The reaction utilizes cheap and readily available bulk chemicals, it is quick, easy and the yield is extremely high. A specific example of the reaction is as follows:

The resultant acetal contains a highly active chloro group, activated by the adjacent amide carbonyl. This makes the subsequent ether forming reaction very facile. Additionally, the acetamido grouping has an advantageous input to the overall lyophillicity of the molecule, and the polymer formed after the subsequent reaction with polyvinyl alcohol.

A specific example of the reaction is as follows:

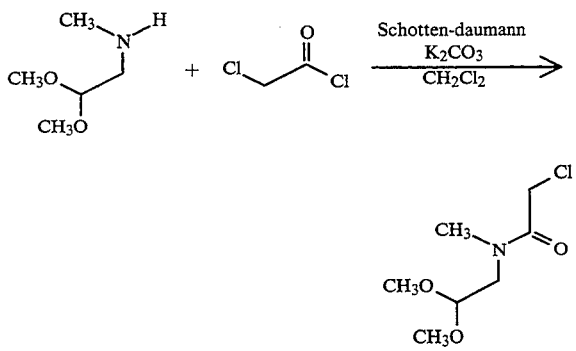

These processes permit freedom of substitution in the styryl ring, permitting choice of absorption, activity, solubility and cost. Furthermore it is a simple process to isolate two or more derivatives with very different absorption characteristics and combine them to provide a broader spectrum sensitive product, increasing exposure speed with a wide variety of different exposure speed with a wide variety of different exposure sources. The aforementioned patents are very restricted by comparison. The current patent affords water solubility where the entity that is the connecting point to the colloid, is via an ether linkage on the quinoline ring.

In addition to being able to easily mix the photodimerizable entities, the photopolymer can be further modified by the addition of non-light sensitive co-reactants during the condensation with polyvinyl alcohol to change the properties of adhesion, solubility, or resistance to solvents or water. Examples of such non-light sensitive co-reactants are acetaldehyde, its dialkyl acetal, chloroacetaldehyde dialkyl acetals, methylaminoacetaldehyde dimethyl acetal, propionaldehyde, glyoxyllic acid, sulfobenzaldehyde, etc. The polyvinyl alcohol may be any partially or fully hydrolysed grade, and the photopolymers can be prepared by reacting the photodimerizable salt form of the styryl base in an aqueous solution of he polyvinyl alcohol in the presence of an acid catalyst. The reaction is usually carried out at a pH of around 2.0 using hydrochloric, sulfuric, phosphoric or an organic sulphonic acid. The reaction is usually carried out at about 70° C. for a period of 4–8 hours.

However, the time and temperature can be varied a great deal, if required. The photopolymer may be separated by precipitation in a suitable non solvent (e.g., acetone), used directly, or after the pH has been ameliorated by use of an ion exchange resin etc.

Additionally, for the efficiency of the photoreaction, it is highly desirable that the exposed species (the entity remaining after the photo destruction of the chromophore) does not absorb a similar wavelength to the photoactive chromophore, and that the photoactive chromophore is rapidly destroyed by actinic light. This prevents the surface layer from self-screening or showing a "filtering" effect on the underlying layers.

The photopolymers characterized by the present invention have a very high photoefficiency, allowing thick layers of the photopolymer material to be hardened throughout the entire thickness of the coating, even with a relatively short exposure time to light of a suitable wavelength. They display a faster photospeed than diazo or other systems as described previously. The mechanism of cross-linking in this particular patent is by photodimerisation, and hence none of the photopolymers characterized by the patent, exhibit the susceptibility to oxygen, moisture and temperature of some other systems.

The photodimerizable chromophore need only be present in low concentration, less than 5 mole % based on the polyvinyl alcohol colloid, in order to provide high levels of photosensitivity. Consequently, many of the admirably properties of polyvinyl alcohol (its resistance to a very wide range of solvents, and its ease of degradation with low concentration of an aqueous solution of metaperiodate or bleach) are retained. The photopolymers described in the present invention are suitable for a very wide range of applications, and can be used in both photographic and photochemical processes where a resist, stencil or relief image is required, for example as an etching resist for printing plates, and cylinders, name plates, dials, etc: as resists for plating processes (preparation of printed circuit boards) as ink accepting images for lithographic plates, and as stencils for screen printing stencils. They may also be used in the preparation of photomasks for cathode ray tubes as used in both black and white and color television sets. They can also find use in the preparation of specialized water-based UV curable inks. As previously mentioned, the photopolymers characterized by the present invention can be very easily modified to cover a previously unprecedented range of wavelengths, making them suitable for use with a variety of different laser devices such as used in the direct scanning of lithographic printing plates.

The invention will become clearer from the examples which follow. These examples are given by way of illustration and are not to be considered as limiting.

EXAMPLE 1

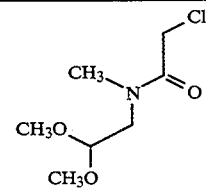

| | |
|---|---|
| Water | 200 cc |
| Anhydrous Potassium Carbonate | 168.0 g. |
| To the above solution added: | |
| Maadma | 144.0 g |
| Ice | 400.0 g |
| Methylene Chloride | 400.0 g |
| Liquid surfactant | 2.0 g |
| To the resultant stirred dispersion, added dropwise with stirring over a period of 30 minutes: | |
| Chloroacetyl Chloride | 142.0 g |
| Methylene Chloride | 100.0 g |
| During the addition, added portionwise to keep the reaction temperature below 5° C. | |

-continued

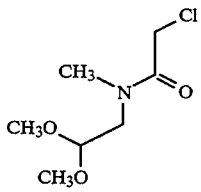

| Ice | 400.0 g |

Continued stirring for 30 minutes after the addition had been completed, allowing the reaction mixture to warm during that time. Separated off the organic layer, and extracted the aqueous layer 3 times with small amounts of methylene chloride. Combined extracts with the original organic layer, treated with a small amount of decolorising charcoal, filtered, and removed the solvent in vac on a rotary evaporator leaving a pale yellow oil.
Yield: 234.0 g

EXAMPLE 2

8-Hydroxy-2-[3-4-5-Trimethoxystyryl]-Quinoline

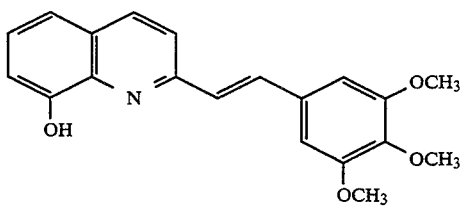

| 8-Hydroxy-Quinaldine | 16.0 g |
| 3-4-5 Trimethoxy-Benzaldehyde | 19.6 g |
| Xylene | 100.0 cc |
| Dimethyl Formamide (DMF) | 8.0 g |
| p-Toluene Sulfonic Acid (PTSA) | 8.0 g |

Stirred under reflux, [Dean & Stark] for 10 hours, cooled, diluted with hexane, filtered and washed with a little hexane. Dispersed pale orange solid in very hot water, stirred and added:

| Sodium Carbonate | 2.2 g | pH rose to about 9, stirred at near boiling for 15 minutes, filtered and washed with hot water. Air dried yellow solid.
Yield: 28.2 g

EXAMPLE 3

8-[N-2-Dimethoxyethyl]-N-Methyl-Acetamidoxy-2-[3-4-5-Trimethoxystyryl]-Quinoline

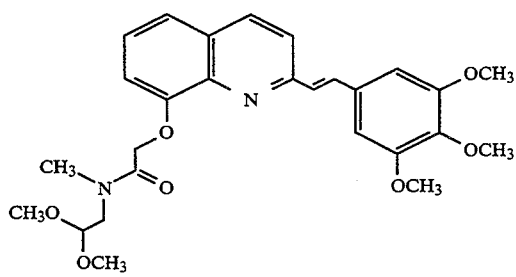

| 8-Hydroxy-2-[3-4-5-Trimethoxy]- | 28.2 g |

-continued

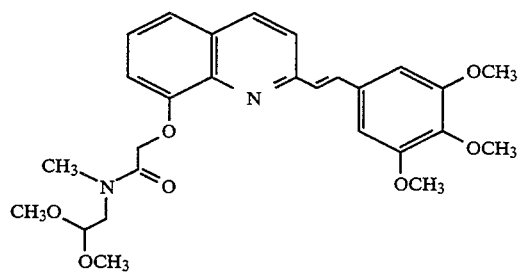

| Styryl-Quinoline | |
| Acetone | 180.0 g |
| N-2-Dimethoxyethyl-N-Methyl- | 17.5 g |
| Chloroacetamide | |
| To the above solution, added with stirring: | |
| Anhydrous Potassium Carbonate | 12.5 g |
| Stirred under reflux for 12 hours, then, poured with stirring onto to: | |
| Cold water | 700 cc |

A buff sticky solid resulted. Decanted off water layer and dissolved up resultant sticky solid in hot methanol, cooled, filtered and washed with cold methanol. Air dried cream solid.
Yield: 21.0 g

EXAMPLE 4

Condensation of 8-[N-2-Dimethoxyethyl-N-Methyl-Acetamidoxy-2 Styryl-Quinoline with Polyvinyl Alcohol (PVOH)

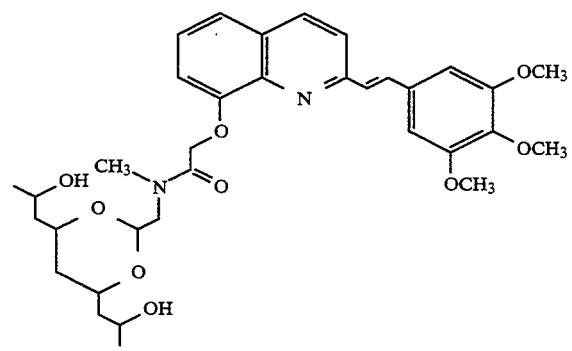

| Boiling Water | 400.0 cc |
| To the above added with vigorous stirring: | |
| Vinol 325 brand of PVOH | 21.0 g |
| a medium molecular weight 98.0–98.8 saponified polyvinyl acetate, manufactured by Air Products | |
| When a complete solution had formed and the temperature had fallen to around 70° C. added with stirring: | |
| 8-[N-2-Dimethoxyethyl]-N-Methyl- Acetamidoxy-2 Styryl-Quinoline | 3.6 g |
| Followed by: | |
| Conc. HCl | 2.0 g |

Continued stirring and heating at 60°–70° C. for 5 hours, made up water losses, covered and allowed to stand over the weekend.
Coated 230 white polyester [1 b] and exposed in 5 unit steps to the VNH fluorescent lamp. Washout a little difficult, all steps held on, and an excellent reproduction of the art work resulted.

EXAMPLE 5

8-[N-2-Dimethoxyethyl-N-Methyl-Acetamidoxy-2 Styryl-Quinoline

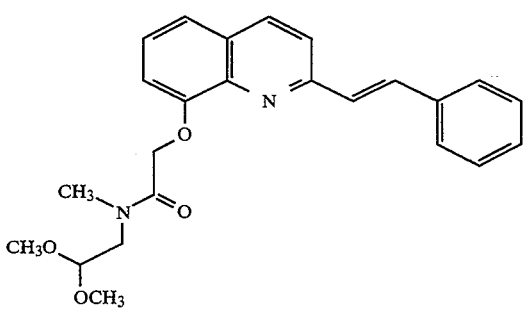

| 8-Hydroxy-2-Styryl-Quinoline | 5.0 g |
|---|---|
| Acetone | 40.0 g |
| N-2-Dimethoxyethyl-N-Methyl-Chloroacetamide | 4.0 g |
| To the above solution, added with stirring: | |
| Anhydrous Potassium Carbonate | 3.2 g |
| Stirred under reflux for 12 hours and poured on to: | |
| Cold water | 350 cc |

Stirred, filtered and washed with water. Air dried yellow granular solid.

Yield: 7.8 g

EXAMPLE 6

2-[3,4-Dioxymethylenestyryl]-8-Hydroxy-Quinoline

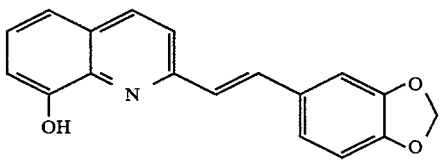

| 8-Hydroxy-Quinaldine | 64.0 g |
|---|---|
| Piperonal | 64.0 g |
| Xylene | 400.0 cc |
| Dimethyl Formamide (DMF) | 32.0 g |
| p-Toluene Sulfonic Acid (PTSA) | 32.0 g |

Stirred under reflux, [Dean & Stark] conditions. After approximately 2.5 hours, a bright yellow solid precipitated, continued stirring under Dean & Stark reflux for a further 6 hours, after which no more water appeared to be evolved from the reaction. Distilled off approximately 200 cc of solvent, allowed to cool a little, then added carefully:

| Heptane | 250.0 cc |
|---|---|

Stirred, and left to cool overnight. Filtered, washed with a little heptane then dispersed solid in boiling water. Stirred at near boiling temperature, then carefully added:

| Anhydrous Sodium Carbonate | 10.0 g |
|---|---|

Continued heating and stirring for a period of 2 hours, filtered hot and washed with hot water. Oven dried cream-buff solid.

Yield: 97.5 g

EXAMPLE 7

2-[4-Methoxystyryl]-8-Hydroxy-Quinoline

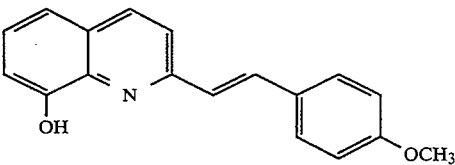

| 8-Hydroxy-Quinaldine | 64.0 g |
|---|---|
| 4-Anisaldehyde | 45.0 g |
| Xylene | 400.0 cc |
| DMF | 32.0 cc |
| PTSA | 32.0 g |

Stirred under reflux, [Dean & Stark] conditions. After approximately 1 hour, a bright yellow solid precipitated, continued stirring under Dean & Stark reflux for a further 7 hours, after which no more water appeared to be evolved from the reaction. Distilled off approximately 200 cc of solvent, allowed to cool a little, then added carefully:

| Heptane | 250.0 cc |
|---|---|

Stirred, and allowed to cool. Filtered, washed with a little heptane then dispersed solid in boiling water. Stirred at near boiling temperature, then added carefully

| Anhydrous Sodium Carbonate | 10.0 g |
|---|---|

Continued heating and stirring for a period of 2 hours, filtered hot and washed with hot water. Oven dried cream-buff solid.

Yield: 94.6 g

EXAMPLE 8

2-[3,4-Dioxymethylenestyryl]-8-[2-Dimethoxyethoxy]-Quinoline

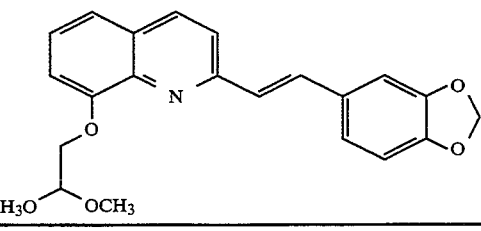

| 2-[3,4-Dioxymethylenestyryl]-8-Hydroxy-Quinoline | 29.1 g |
|---|---|
| Chloroacetaldehyde dimethylacetal | 20.1 g |
| Potassium Bromide | 0.5 g |
| Dimethyl Formamide (DMF) | 100.0 g |
| Potassium Carbonate | 21.5 g |

Stirred under reflux for 20 hours, allowed to cool and poured on to cold water. As lightly sticky solid precipated. Decanted off water layer and dissolve up remaining solid in methylene chloride. Washing solvent layer with water then removed the solvent using a rotary evaporator, leaving a dark oil.

Yield: 31.2 g

EXAMPLE 9

Condensation of
8-[2-Dimethoxyethoxy]-2-Styryl-Quinoline with
Gohsenol GH 20 brand of PVOH

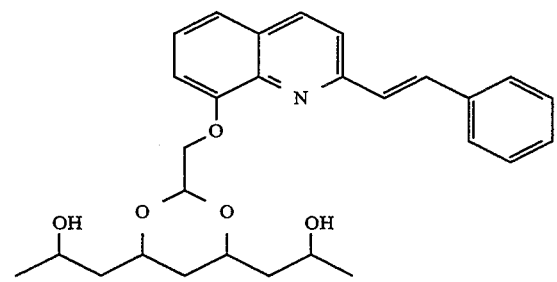

| | |
|---|---|
| Boiling Water | 400.0 cc |
| To the above vigorous stirred solution added: | |
| Gohsenol GH20 brand of PVOH | 20.0 g |
| a high molecular weight 86.5–89.0 percent saponified polyvinyl acetate, manufactured by Nippon Gohsei | |
| When a complete solution had formed, and the temperature had dropped to around 70° C., added the following with stirring: | |
| Conc. HCl | 2.0 g |
| Immediately followed by a warm solution of: | |
| 8-[2-Dimethoxyethoxy]-2 Styryl-Quinoline | 3.4 g |
| Ethanol | 8.6 g |
| Stirred at 65°–70° C. for 4 hours, then added: | |
| Conc. HCl | 2.0 g |

Continued heating at 65°–70° C. for an additional 3 hours, allowed to cool, made up water losses and coated 230 mesh white polyester fabric 1b, dried thoroughly and exposed to a VNH fluorescent lamp in 5 unit steps. Good washout, first step had partially washed away, other steps all held on. Good image.

EXAMPLE 10

Condensation of
8-[N-2-Dimethoxyethyl]-N-Methylacetamidoxy-2-Styryl-Quinoline, and Glyoxyllic Acid with Gohsenol GH23 brand of PVOH

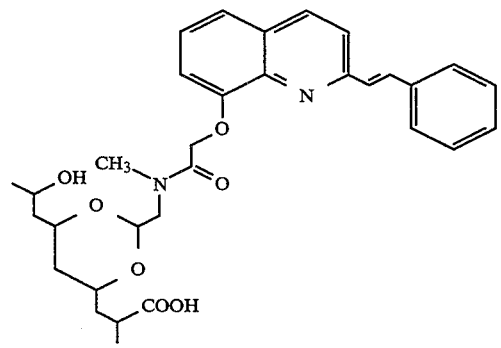

| | |
|---|---|
| Boiling Water | 400.0 cc |
| To the above vigorous stirred solution added: | |
| Gohsenol GH23 brand of PVOH | 20.0 g |
| a high molecular weight 86.5–89.0 saponified polyvinyl acetate, having a molecular weight higher than GH20, manufactured by Nippon Gohsei | |
| When a complete solution had formed, and the temperature had dropped to around 70° C., added the following with stirring: | |
| Conc. HCl | 2.0 g |

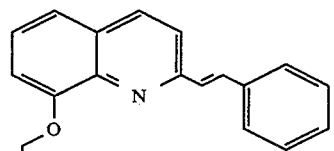

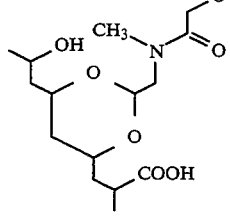

| | |
|---|---|
| Immediately followed by: | |
| 8-[N-2-Dimethoxyethyl]-N-Methyl-Acetamidoxy-2 Styryl-Quinoline | 3.0 g |
| and: | |
| 50% Glyoxyllic Acid | 5.0 g |

Continued stirring at 65°–70° C. for 7 hours, cooled, and adjusted for water loss to give an approx 10% w/w solution.

Coated on 230 white polyester fabric, [1 coat on the print side]. Dried and exposed to the VNH fluorescent lamp in 5 unit steps.

A latent image formed but would not washout with a simple water spray, however, by spraying dilute ammonia on to the stencil, and then spraying with water an excellent image formed that washed out very easily. The image was outstanding at all steps, and after drying proved to be extremely water resistant, yet decoated easily with a dilute periodate solution.

EXAMPLE 11

2-4-Methoxystyryl-8-[2-Diethoxyethoxy]-Quinoline

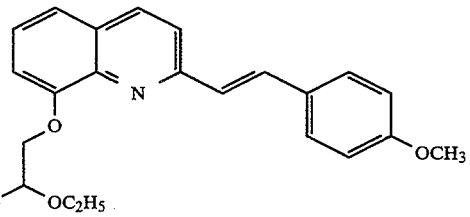

| | |
|---|---|
| 2-4-Methoxystyryl-8-Hydroxy-Quinaldine | 5.5 g |
| DMF | 11.0 g |
| Bromoacetaldehyde-Diethyl-acetal | 4.1 g |
| Anhydrous Potassium Carbonate | 3.0 g |

Stirred under gentle reflux for 18 hours, poured on to water, stirred, extracted with chloroform and washed extract with water. Filtered chloroform solution and removed solvent in vac on the rotary evaporator, leaving a dark oil which solidified on standing.

Yield: 7.0 g

EXAMPLE 12

Condensation of 2-4-Methoxystyryl-8-[2-Diethoxyethoxy]Quinoline with Vinol 540 grade of PVOH

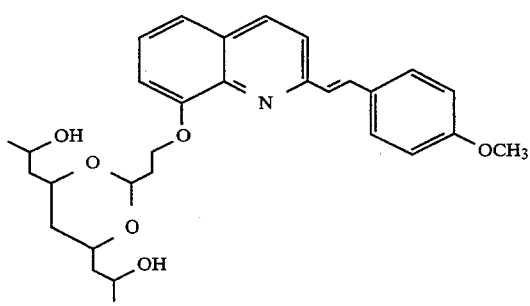

| Boiling Water | 300.0 cc |
| --- | --- |
| To the above added with stirring: | |
| Vinol 540 | 15.0 g |
| When a complete solution had formed, added with stirring: | |
| Conc. HCl | 2.0 g |
| Followed by a solution of: | |
| 2-4-Methoxystyryl-8- | 3.2 g |
| [2-Diethoxyethoxy] Quinoline | 20.0 g |
| Ethanol | |

Stirred at 70°–75° C. for 6.5 hours, cooled adjusted volume to give an approx 10% solution.

Coated on to 230 white polyester, 1 coat on the back. Exposed in 5 unit steps on VNH fluorescent lamp exposure device. Image formed, difficult washout, but all steps held on. Vinol 540 is a high molecular weight 87.0–89.0 percent saponified polyvinyl acetate.

I claim:

1. A composition containing at least 2 photosensitive polymers of the structure

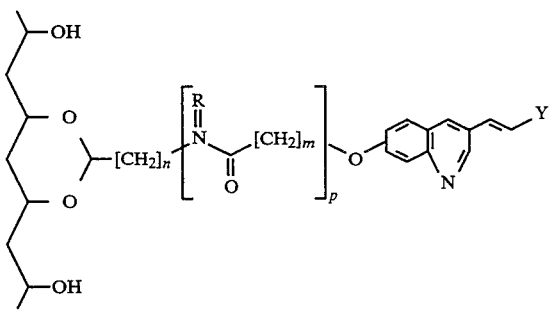

where

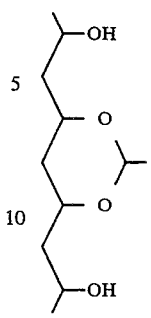

represents a polyvinyl alcohol unit,
n is an integer from 1 to 3,
R is alkyl or substituted alkyl,
m is an integer from 1 to 3,
m is an integer from 1 to 3,
p is either zero or 1, and
Y is

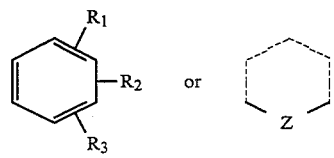

where $R_1$, $R_2$, and $R_3$ are hydrogen, alkyl, alkenyl, alkoxy, aralkyl, substituted alkyl, substituted alkoxy, carboxy, carboxy ester, amino, substituted amino, amido, substituted amido, cyano, hydroxy, nitro, isocyanato, sulphonyl halide, sulphonic acid, and halide and may be the same or different and

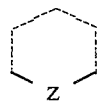

is a 5 or 6-membered ring structure with Z selected from the group consisting of oxygen and sulfur.

2. A composition according to claim 1, wherein the polyvinyl alcohol is derived from 70% to 99% saponified polyvinyl acetate.

3. A polymer composition according to claim 2, which contains as a non-light sensitive, modifying compound, at least one compound containing a formyl or acetal entity.

4. A polymer compound according to claim 3, wherein the modifying non-light sensitive compound is acetaldehyde, acetaldehyde dimethyl acetal, acetaldehyde diethyl acetal, chloral, chloroacetaldehyde dimethyl acetal, chloroacetaldehyde diethyl acetal, methylaminoacetaldehyde dimethyl acetal, 4-dimethylamino benzaldehyde, sulfo benzaldehyde or glyoxyllic acid.

5. A polymer composition according to claim 4, wherein the photosensitive group in the polymer is present at a concentration of from about 0.5–20 mole % based on the polyvinyl alcohol in the composition.

6. A polymer composition according to claim 5, wherein at least one component selected from pigments, fillers, latex emulsions, plasticisers and resins is also present.

* * * * *